(12) United States Patent
Takamura et al.

(10) Patent No.: US 6,379,806 B1
(45) Date of Patent: Apr. 30, 2002

(54) HEAT-RESISTANT SILICONE RUBBER COMPOSITE SHEET HAVING THERMAL CONDUCTIVITY AND METHOD OF PRODUCING THE SAME

(75) Inventors: Toru Takamura, Tokyo; Akio Nakano, Gunma-Ken, both of (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/610,955

(22) Filed: Jul. 6, 2000

(30) Foreign Application Priority Data

Jul. 7, 1999 (JP) .......................................... 11-192785

(51) Int. Cl.$^7$ .............................. B32B 9/04; C08K 3/04; C08G 77/04

(52) U.S. Cl. ........................ 428/447; 428/200; 428/202; 428/206; 428/208; 428/451; 252/511; 252/512; 252/513; 252/516; 524/424; 524/430; 524/433

(58) Field of Search ................................. 428/200, 202, 428/206, 208, 447, 451; 252/511, 512, 513, 516; 524/424, 430, 433

(56) References Cited

U.S. PATENT DOCUMENTS

| | | | |
|---|---|---|---|
| 3,234,175 A | | 2/1966 | Pike |
| 4,448,840 A | * | 5/1984 | Matsushita .................. 428/266 |
| 5,021,494 A | | 6/1991 | Toya |
| 5,082,596 A | * | 1/1992 | Fukuda et al. ............... 252/511 |
| 5,352,731 A | * | 10/1994 | Nakano et al. ............. 524/786 |
| 5,705,258 A | | 1/1998 | Okami et al. |
| 5,807,507 A | | 9/1998 | Hirano |
| 6,054,198 A | * | 4/2000 | Bunyan et al. ............. 428/40.5 |
| 6,074,963 A | * | 6/2000 | Okami et al. ................. 442/16 |
| 6,169,142 B1 | * | 1/2001 | Nakano et al. ............. 524/862 |

FOREIGN PATENT DOCUMENTS

| | | |
|---|---|---|
| FR | 2570383 | 3/1986 |
| JP | 08 174765 | 7/1996 |

OTHER PUBLICATIONS

Computer English translation of JP 07–011010, Nakano et al., Jan. 13, 1995.*
Computer English translation of JP 08–174765, Nakano et al., Jul. 9, 1996.*
PAJ vol. 18, No. 252 JP 06 036853.
Derwent WPI RU 2129135 (Apr. 20, 1999).
PAJ vol. 1995 No. 4 JP 07 011010 (Jan. 13, 1995).
PAJ vol. 14, No. 37 JP 01 272667 (Oct. 31, 1989).
PAJ vol. 17, No. 25 JP 05198344 (Aug. 6, 1993).

* cited by examiner

Primary Examiner—Robert Dawson
Assistant Examiner—Jeffrey B. Robertson
(74) Attorney, Agent, or Firm—Millen, White, Zelano & Branigan, P.C.

(57) ABSTRACT

A thermally conductive heat-resistant silicone rubber composite sheet which has a heat-resistant resin film layer on at least one side of a silicone rubber sheet and can be suitably used in a hot pressing process, with the silicone rubber sheet being a sheet molded of a silicone rubber composition that comprises (A) 100 parts by weight of organopolysiloxanes having an average polymerization degree of at least 200, (B) 0 to 150 parts by weight of carbon black containing volatile impurities except water in a content of at most 0.5 weight %, (C) 0 to 1,600 parts by weight of at least one thermally conductive substance selected from the group consisting of metals, metal oxides, metal nitrides and metal carbides and (D) a curing agent, provided that the total proportion of the components (B) and (C) is from 10 to 1,600 parts by weight, and having a volatile impurity content of at most 0.2 weight % when it is heated at 150° C. for 3 hours: and a method of producing the aforesaid composite sheet.

11 Claims, No Drawings

HEAT-RESISTANT SILICONE RUBBER COMPOSITE SHEET HAVING THERMAL CONDUCTIVITY AND METHOD OF PRODUCING THE SAME

FIELD OF THE INVENTION

The present invention relates to a heat-resistant composite sheet having thermal conductivity and, more particularly, to a thermally conductive heat-resistant silicone rubber composite sheet suitable as a thermally conductive cushion sheet used when a hot pressing process is adopted for forming laminates or flexible boards and for connecting electrodes, such as electrodes of a liquid crystal display, by the use of an electrically conductive anisotropic film. In addition, the invention is concerned with a method of producing the aforesaid silicone rubber composite sheet.

BACKGROUND OF THE INVENTION

Hitherto known thermally conductive electrical insulating materials are, e.g., silicone rubber in which beryllium oxide powder, aluminum oxide powder, aluminum hydroxide powder, magnesium oxide powder or zinc oxide powder is mixed (as disclosed in Japanese Tokkai Sho 47-32400, wherein the term "Tokkai" means an "unexamined published patent application"), and boron nitride-containing silicone rubber which is reinforced by an insulator net (as disclosed in Japanese Jikkai Sho 54-184074, wherein the term "Jikkai" means an "unexamined published utility model application"). These silicone rubbers are already used as heat-dissipating insulators for exothermal components, such as power transistors, thyristors, rectifiers, transformers, power MOS and FET. However, those silicone rubbers have a drawback of deteriorating under the influences of impurities in the thermal conductivity imparting agents and their pH values when used under a high temperature condition, specifically 200° C. or above.

On the other hand, the foregoing thermally conductive electrical insulating sheets have been employed as cushion sheets in the cases of forming laminates or flexible printed circuit boards by means of a press forming machine, or in the case where an electrically conductive anisotropic film is subjected to hot pressing by means of a pressing machine in order to connect electrode terminals of liquid crystal display and an operation circuit-mounted flexible printed circuit board. For such uses, the glass cloth-reinforced silicone rubber sheet in which boron nitride is mixed is disclosed in Japanese Tokkai Hei 5-198344, and the glass cloth-reinforced antistatic silicone rubber sheet in which both boron nitride and an electrically conductive substance are mixed is disclosed in Japanese Tokkai Hei 6-36853. These cases also have the same deterioration problem of silicone rubber under a high temperature condition as mentioned above.

In recent years, the material properties of flexible printed circuit boards and those of electrically conductive anisotropic films have been changed so as to have suitability for high-temperature forming, while the forming temperature has also been raised for increasing productivity by reduction in a pressing cycle time. Under these circumstances, the heat resistance and the thermal conductivity of a silicone rubber sheet as thermally conductive electrical insulator are of increasing importance. Therefore, Japanese Tokkai Hei 7-11010 proposes the silicone rubber simple sheet in which the carbon black containing volatile components, exclusive of water, in a proportion of at most 0.5 weight % is used as a thermal conductivity providing agent to ensure high heat resistance enough to withstand exposure to temperatures of 300° C. or higher and satisfactory thermal conductivity.

However, such an electrical insulating sheet having thermal conductivity is short of strength because it is a simple sheet of silicone rubber, and so there is a fear of breaks by repeated use. In addition, the tackiness of silicone rubber sheet causes another problem that the sheet sticks to the pressure applying tool and the pressed material after hot pressing, and thereby the workability is considerably worsened. Further, when it is used at a temperature of 300° C. or above as in the case where electrode terminals of liquid crystal display and an operation circuit-mounted flexible printed circuit board are connected via an electrically conductive anisotropic film in accordance with a hot pressing process using a pressing machine, the silicone rubber sheet causes a problem such that the volatile components present therein pollute the electrode terminals and the operation circuit. In order to avoid such detrimental effects of the silicone rubber sheet, the heating treatment of the sheet at a high temperature and the resin film lamination on the sheet are generally carried out. However, the heating of the laminated sheet up to a high temperature of 150° C. or above causes a warp in the sheet because the contraction of the rubber occurs, thereby spoiling the workability.

So our intensive studies have been made to look for thermally conductive heat-resistant silicone rubber composite sheets having not only satisfactory thermal conductivity but also sufficient strength, and further causing no firm adhesion to pressurizing tools by rubber tackiness and ensuring good workability. As a result, it has been found that satisfactory results can be obtained when the silicone rubber sheet in which carbon black containing volatile impurities except water in a content of at most 0.5 weight % and at least one ingredient selected from the group consisting of metals, metal oxides, metal nitrides and metal carbides are mixed in specified proportions is reinforced by a heat-resistant resin film, thereby achieving the present invention.

SUMMARY OF THE INVENTION

Therefore, one object of the invention is to provide a thermally conductive heat-resistant silicone rubber composite sheet that has not only high thermal conductivity but also sufficient strength, causes no firm adhesion to pressurizing tools by rubber tackiness and ensures good workability.

Another object of the invention is to provide a method of producing a silicone rubber composite sheet having the aforementioned characteristics.

The foregoing objects of the invention are attained with a composite sheet comprising a silicone rubber sheet and a heat-resistant resin film layer provided on at least one side of the silicone rubber sheet, wherein the silicone rubber sheet is a sheet molded of a silicone rubber composition which comprises (A) 100 parts by weight of organopolysiloxanes having an average polymerization degree of at least 200, (B) 0 to 150 parts by weight of carbon black containing volatile impurities except water in a content of at most 0.5 weight %, (C) 0 to 1,600 parts by weight of at least one thermally conductive substance selected from the group consisting of metals, metal oxides, metal nitrides and metal carbides and (D) a curing agent, provided that the total proportion of the components (B) and (C) is from 10 to 1,600 parts by weight, and having a volatile impurity content of at most 0.2 weight % when it is heated at 150° C. for 3 hours; and with a method of producing the aforesaid composite sheet.

In accordance with the invention, a heat-resistant resin film is stuck on the silicone rubber sheet. So the present thermally conductive heat-resistant silicone rubber composite sheet is free of rubber tackiness troubles, has sufficient strength and can ensure good workability. Further, the present composite sheet does not pollute electrode terminals and operation circuits upon hot pressing because the volatile impurity content therein can be reduced to 0.2 weight % or below. In addition, the carbon black incorporated in the present composite sheet prevents electrostatic buildup to avoid the adhesion of dust to the composite sheet in use and further inhibit electronic components loaded on circuits from causing a breakdown by electric discharge.

DETAILED DESCRIPTION OF THE INVENTION

The organopolysiloxanes as Component (A) of the present silicone rubber composition have an average polymerization degree of at least 200, preferably from 3,000 to 20,000, and are represented by the average composition formula $R_nSiO_{(4-n)/2}$, wherein n is a positive number of from 1.95 to 2.05 and R represents a substituted or unsubstituted monovalent hydrocarbon group. Examples of such a monovalent hydrocarbon group include an alkyl group, such as methyl, ethyl or propyl group, a cycloalkyl group, such as cyclopentyl or cyclohexyl group, an alkenyl group, such as vinyl or allyl group, an aryl group, such as phenyl or tollyl group, and halogenated hydrocarbon groups, such as the groups recited above whose hydrogen atoms are partly replaced by chlorine or fluorine atoms. When 0.001 to 5 mole %, especially 0.01 to 1 mole %, of R are alkenyl groups, the resultant organopolysiloxanes can have good effects.

In general the main chain of organopolysiloxanes suitable for the invention is constituted of dimethylsiloxane units alone or dimethylsiloxane units modified in parts by introduction of vinyl, phenyl or trifluoropropyl groups. Further, it is advantageous that the molecular chain ends of the present organopolysiloxanes be blocked with triorganosilyl groups, such as trimethylsilyl, dimethylvinylsilyl or trivinylsilyl groups, or hydroxyl groups. In addition, the organopolysiloxanes suitable for Component (A) are those having viscosity of at least 300 cs at 25° C.

In cases where the organopolysiloxanes having an average polymerization degree lower than 200 are used as Component (A), the cured composition is inferior in mechanical strength, and the rubber sheet made therefrom is easily broken.

The carbon black as Component (B) not only raises heat resistance, thermal conductivity and mechanical strength of the composite sheet, but also makes the silicone rubber sheet electrically conductive to impart antistatic properties thereto. The content of volatile impurities except water in carbon black usable as Component (B) of the invention is at most 0.5 weight %, preferably at most 0.4 weight %. While the carbon black products are generally classified by their production methods into furnace black, channel black, thermal black and acetylene black, the acetylene black and the electrically conductive carbon black disclosed in Japanese Tokkai Hei 1-272667 are suitable for the present carbon black having a volatile impurity content of at most 0.5 weight %.

As a method of measuring the volatile impurity content as mentioned above, the method described in JIS K 6221 as "Method of testing carbon black for rubber use" is adopted in the invention. More specifically, a prescribed amount of carbon black is placed in a crucible, heated at 950° C. for 7 minutes, and then the evaporation loss is measured.

The suitable proportion of Component (B) mixed is from 0 to 150 parts by weights, preferably from 10 to 100 parts by weight, particularly preferably from 20 to 80 parts by weight, to 100 parts by weight of Component (A). When the proportion of Component (B) used is increased beyond 150 parts by weight, it becomes difficult to mix Component (B) homogeneously with the other components and the moldability of the resulting composition is reduced.

Component (C) is at least one substance selected from the group consisting of metals, metal oxides, metal nitrides and metal carbides, and functions so as to impart thermal conductivity to the present silicone rubber sheet. Examples of such a substance include silver powder, copper powder, iron powder, nickel powder, zinc oxide, magnesium oxide, aluminum oxide, silicon oxide, iron oxides, boron nitride, aluminum nitride, silicon nitride, silicon carbide and boron carbide.

The suitable proportion of Component (C) mixed is from 0 to 1,600 parts by weight, preferably from 0 to 1,200 parts by weight, to 100 parts by weight of Component (A). When the proportion of Component (C) used is increased beyond 1,600 parts by weight, it becomes difficult to mix Component (C) homogeneously with the other components and the moldability of the resulting composition is reduced.

The total proportion of Components (B) and (C) in the present composition is required to be from 10 to 1,600 parts by weight, preferably from 40 to 1,200 parts by weight, particularly preferably from 45 to 1,000 parts by weight. In a case of placing importance on the heat resistance of silicone rubber, it is advantageous to raise the proportion of carbon black used.

The curing agent as Component (D) can be selected properly from conventional curing agents for silicone rubber use. Examples of a curing agent suitable for Component (D) include organic peroxides such as di-t-butyl peroxide, 2,5-dimethyl-2,5-di(t-butylperoxy)hexane and dicumyl peroxide, which are suitable for cure by radical reaction; curing agents suitable for cure by addition reaction, such as the combination of organohydrogenpolysiloxanes containing per molecule at least two hydrogen atoms directly attached to silicon atoms with a platinum catalyst in a case where the organopolysiloxanes as Component (A) contain at least two alkenyl groups per molecule; and curing agents suitable for cure by condensation reaction, such as organosilicone compounds containing at least two hydrolyzable groups per molecule, specifically at least two alkoxy, acetoxy, ketoxime or propenoxy groups per molecule, in a case where the organopolysiloxanes used as Component (A) contain at least two silanol groups per molecules.

In adding the curing agent as recited above, the amount thereof may be in the same range as adopted in usual curing of silicone rubber compositions. Specifically, the suitable amount of organic peroxide added in radical reaction is from 0.1 to 10 parts by weight per 100 parts by weight of Component (A); while, in the case of addition reaction, it is effective to use organohydrogenpolysiloxanes in such an amount that the proportion of their SiH groups to the alkenyl groups in Component (A) is from 0.5 to 5 mole % and a platinum catalyst in an amount of 1 to 2,000 ppm.

The heat resistance of the present silicone rubber composition can further be raised by the addition of cerium oxide powder. The suitable amount of cerium oxide powder added is from 0.1 to 5 parts by weight per 100 parts by weight of Component (A). When the amount added is increased beyond 5 parts by weight, the heat resistance is sometimes lowered by contraries. Additionally, it is beneficial to use cerium powder having relatively large specific surface area of at least 50 m²/g, measured by BET method.

To the silicone rubber composition used in the invention, various additives may be added, if desired. Examples of such additives include a filler such as clay, calcium carbonate or diatomaceous earth, a dispersing agent such as a low molecular siloxane ester or a silanol group-containing low molecular organosiloxane, an adhesiveness-imparting agent such as a silane coupling agent or a titanium coupling agent, an incombustibility-imparting platinum group metal catalyst, and poly(tetrafluoroethylene) particles for increasing the Green strength of rubber compound. Additionally, the present silicone rubber composition can be prepared by kneading the ingredients as recited above by means of a mixing machine, such as a two-rod roll, a kneader, a Banbury mixer or a planetary mixer. As to the curing agent, however, the suitable addition time therefor is just before the use of the composition.

The heat-resistant resin film used in the invention is required to have high mechanical strength and excellent releasability at high temperatures, because the present thermally conductive silicone rubber composite sheet is used even at temperatures of around 300° C. Therefore, the resin films having glass transition points of 200° C. or higher, such as aromatic polyimide films, polyamideimide films, aromatic polyamide films, polyether sulfone films and polyether imide films, and fluorine-contained resin films having melting points of 300° C. or higher, such as polytetrafluoroethylene (PTFE) film and tetrafluoroethylene-perfluoroalkyl vinyl ether copolymer (PFA) film, can be utilized as heat-resistant resin films for the invention.

As to examples of commercially available heat-resistant resin films, Capton (trade name, a product of Toray Du Pont Co., Ltd.), Apical (trade name, a product of Kanegafuchi Chemical Industry Co., Ltd.) and Eupilex (trade name, a product of Ube Industries, Ltd.) are on the market as aromatic polyimide film; Aramica (trade name, a product of Asahi Chemical Industry Co., Ltd.) is on the market as organic polyamide film; and Teflon (trade name, a product of Du Pont Japan Limited) and Nitoflon (trade name, a product of Nitto Electric Industrial Co., Ltd.) are on the market as fluorine-contained resin.

In particular, it is favorable to reinforce the heat-resistant resin film with glass cloth from the viewpoint of mechanical strength.

Further, it is advantageous to impart electric conductivity to the heat-resistant resin film as recited above by mixing carbon black in the resin, or impart thermal conductivity thereto by mixing therein a thermally conductive powder such as aluminum oxide powder or magnesium oxide powder. As to the thermal conductivity-imparted heat-resistant resin film, Capton MT (trade name, a product of Toray Du Pont Co., Lltd.) is on the market.

The suitable thickness of the present heat-resistant resin film is from 5 to 300 μm, particularly from 10 to 100 μm. When the thickness of resin film is too small, the film itself is insufficient in mechanical strength, so there is a fear that the film is broken at the time when the sheet is molded or used for hot pressing; while, when the thickness is too great, the transmission of heat through the film is retarded, so that satisfactory hot pressing cannot be achieved.

In molding the present silicone rubber composition into silicone rubber sheets, the following two methods can be adopted: One method comprises pushing out a silicone rubber composition containing up to a curing agent from a calender or extruder to shape the composition into a sheet of the desired thickness, and then curing them by heating; and the other method comprises coating a carrier film with a liquid silicone composition or a silicone rubber composition dissolved in a solvent such as toluene, curing the composition, and then peeling the cured composition from the carrier film. In order to achieve the volatile impurity content of 0.2 weight % at the most, preferably 0.1 weight % at the most, in the present silicone rubber sheet at the time when heated at 150° C. for 3 hours, the foregoing cured sheet or coating is desirably subjected to heat treatment. To the invention, it is advantageous to place the molded sheets as mentioned above in a dryer or continuous furnace and subject them to heat treatment at a temperature of at least 150° C.

In bonding the thus prepared silicone rubber sheet to a heat-resistant resin film, it is effective to previously apply a primer to the heat-resistant film. When the heat-resistant resin film used is a fluorine-contained resin film, it is favorable to impart adhesiveness to the film in advance by etching the film with, e.g., a sodium-naphthalene solution.

In order to make the silicone rubber sheet adhere effectively to the heat-resistant resin film, it is advantageous to use an adhesive, especially a silicone adhesive. Suitable examples of a silicone adhesive include adhesion aid-added single-liquid, double-liquid or triple-liquid type silicone rubber and silicone varnish of the type which has tackiness in a fresh stage and comes to have adhesiveness by storage at room temperature or heating. From the viewpoints of adhesiveness and coatability, silicone varnish for adhesion use is preferred in particular.

For making the present composite sheet, it is favorable to coat a silicone adhesive on a heat-resistant resin film such as an aromatic polyimide, polyamideimide or PTFE film, preferably in a thickness of 10 to 50 μm, and then unite the resin film and the present silicone rubber sheet into a laminate after the adhesive is dried or as it remains wet.

The suitable thickness of the thus formed silicone rubber composite sheet is from 0.1 to 10 mm. When the composite sheet has a too small thickness, it sometimes fails in ensuring uniform application of pressure to a material to be pressed in a hot pressing process because of its poor response to the unevenness on the material; while, when the thickness is too great, the resultant sheet retards the transmission of heat in some cases. Additionally, the heat-resistant resin film can be provided on not only one side but also both sides of the present silicone rubber sheet depending on the desired purposes.

Now, the present invention will be illustrated in greater detail by reference to the following examples. However, the invention should not be construed as being limited to these examples.

The entire disclosure of corresponding Japanese application No. Hei 11-192785, filed on Jun. 7, 1999, is hereby incorporated by reference.

EXAMPLE 1

Methylvinylpolysiloxanes constituted of 99.85 mole % of dimethylsiloxane units and 0.15 mole % of methylvinylsiloxane units and having an average polymerization degree of 8,000 were used as Component (A) in an amount of 100 parts by weight. These organopolysiloxanes as Component (A), 50 parts by weight of acetylene black having an average particle size of 40 nm and a volatile impurity content of 0.1 weight % and 5 parts by weight of reinforcing silica Aerosil IR-972 (trade name, a product of Degussa Co.) were mixed with a two-rod roll, and then kneaded homogeneously, thereby preparing a silicone rubber compound.

To 100 parts by weight of the silicone rubber compound prepared above, 0.1 parts by weight of an isopropyl alcohol solution of chloroplatinic acid (platinum content: 2 weight %), 0.05 parts by weight of 3-methyl-1-butyne-3-ol as an acetylenic alcohol and 1.2 parts by weight of methylhydrogenpolysiloxane illustrated below were added, and kneaded with a two-rod roll, thereby preparing a curable silicone rubber composition:

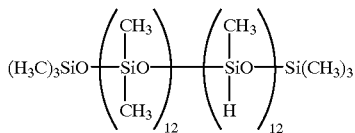

The silicone rubber composition thus prepared was pushed out from a calender roll so as to be shaped into a sheet having a thickness of 0.30 mm, cured by passing through a 150° C. drying oven over 3 minutes, and further heated at 200° C. for 4 hours to remove volatile impurities therefrom. When heated at 150° C. for 3 hours, the thus prepared sheet had a volatile impurity content of 0.08 weight %.

On the other hand, a 12 $\mu$m-thick aromatic polyimide film having a glass transition temperature of at least 350° C. (Capton, trade name, a product of Toray Du Pont Co., Ltd.) was employed as a heat-resistant resin film. This film was coated with an adhesive Primer C (trade name, a product of Shin-Etsu Chemical Co., Ltd.), followed by drying for 30 minutes at room temperature.

On the primer-coated Capton film, the silicone adhesive KE-109A/B (trade name, a product of Shin-Etsu Chemical Co., Ltd.) was coated in a thickness of 50 $\mu$m by means of a roll coater. Thereafter, the resulting film was stuck to the foregoing silicone rubber sheet by means of a laminate roll, and passed through a 160° C. drying oven over 5 minutes. Thus, a thermally conductive heat-resistant silicone rubber composite sheet according to the invention was prepared.

EXAMPLE 2

A thermally conductive heat-resistant silicone rubber composite sheet was prepared in the same manner as in Example 1, except that the heat-resistant resin film was replaced by a 12 $\mu$m-thick aromatic polyamide film having no glass transition point (Aramica, trade name, a product of Ashahi Chemical Industry Co., ltd.).

EXAMPLE 3

A thermally conductive heat-resistant silicone rubber composite sheet was prepared in the same manner as in Example 1, except that the heat-resistant resin film was replaced by a 75 $\mu$m-thick PTFE film having a melting point of 327° C. (Nitoflon, a trade name, a product of Nitto Electric Industrial Co., Ltd.) which was reinforced with glass cloth on one side and processed in advance so as to have adhesiveness on the other side.

EXAMPLE 4

A mixture of 70 parts by weight of methylvinylpolysiloxanes constituted of 99.85 mole % of dimethylsiloxane units and 0.15 mole % of methylvinylsiloxane units and having an average polymerization degree of 8,000 with 30 parts by weight of methylvinylpolysiloxanes constituted of 99.5 mole % of dimethylsiloxane units and 0.5 mole % of methylvinylsiloxane units and having an average polymerization degree of 8,000 was used as Component (A). These organopolysiloxanes as Component (A), 50 parts by weight of acetylene black having an average particle size of 53 $\mu$m and a volatile impurity content of 0.15 weight % and 0.5 parts by weight of cerium oxide powder having a specific surface area of 140 m²/g were mixed with a two-rod roll, and then kneaded homogeneously, thereby preparing a silicone rubber compound.

The rubber compound thus prepared was admixed with the same curing agent as used in Example 1, and shaped into a 0.3 mm-thick silicone rubber sheet by means of a calender roll.

This sheet was heated in a dryer at 200° C. for 4 hours. When heated at 150° C. for 3 hours, the thus prepared sheet had a volatile impurity content of 0.10 weight %.

On the other hand, the adhesive containing 100 parts of silicone varnish adhesive (KR105, trade name, a product of Shin-Etsu Chemical Co., Ltd.) and 3 parts of curing catalyst for silicone varnish adhesive (T12, a trade name, a product of Shin-Etsu Chemical Co., Ltd.) was coated on a 12 $\mu$m-thick Capton film in a thickness of 50 $\mu$m by means of a comma coater, passed through a 60° C. drying furnace over 3 minutes, and then stuck to the foregoing silicone rubber sheet by means of a pressing roll, thereby preparing a thermally conductive heat-resistant silicone rubber composite sheet according to the invention.

EXAMPLE 5

A mixture of 50 parts by weight of methylvinylpolysiloxanes constituted of 99.85 mole % of dimethylsiloxane units and 0.15 mole % of methylvinylsiloxane units and having an average polymerization degree of 8,000 with 50 parts by weight of methylvinylpolysiloxanes constituted of 99.5 mole % of dimethylsiloxane units and 0.5 mole % of methylvinylsiloxane units and having an average polymerization degree of 8,000 was used as Component (A). These organopolysiloxanes as Component (A), 450 parts by weight of alumina having an average particle size of 4 $\mu$m and 0.5 parts by weight of cerium oxide powder having a specific surface area of 140 m²/g were mixed with a two-rod roll, and then kneaded homogeneously, thereby preparing a silicone rubber compound.

The rubber compound thus prepared was admixed with the same curing agent as used in Example 1, and shaped into a 0.3 mm-thick silicone rubber sheet by means of a calender roll. After this sheet was subjected to thermal treatment at 200° C. for 4 hours (When heated at 150° C. for 3 hours, the thus prepared sheet had a volatile impurity content of 0.12 weight %), thereto was stuck a carbon black-mixed conductive Capton film in the same way as adopted in Example 4. Thus, a thermally conductive heat-resistant silicone rubber composite sheet according to the invention was prepared.

Comparative Example 1

The same curable silicone rubber composition as prepared in the same manner as in Example 1 was shaped into a 0.3 mm-thick single sheet of silicone rubber by means of a calender roll.

Comparative Example 2

A 12 $\mu$m-thick Capton film-bonded thermally conductive silicone rubber composite sheet was prepared in the same manner as in Example 1, except that 50 parts by weight of furnace black having an average particle size of 30 nm and a volatile impurity content of 0.7 weight % was mixed as Component (B).

Comparative Example 3

A 12 μm-thick Aramica film-bonded thermally conductive silicone rubber composite sheet was prepared in the same manner as in Example 2, except that 50 parts by weight of furnace black having an average particle size of 30 nm and a volatile impurity content of 1.5 weight % was mixed as Component (B).

Comparative Example 4

A thermally conductive silicone rubber composite sheet was prepared in the same manner as in Example 1, except that a 30 μm-thick polyphenylene sulfide film having a glass transition temperature of 90° C. was used as the resin film. Performance Evaluation of Composite Rubber Sheets A 22 μm-thick anisotropic conductive film was sandwiched between two flexible printed circuit boards provided with 25 μm-pitch copper electrodes (wherein the vertical registration was carried out so that the electrodes to be connected were in a right place), and a 30 μm-thick Teflon film was put on the board situated on the upper side.

On the Teflon film, each of the sheets prepared in Examples 1 to 5 and Comparative Examples 1 to 4 was further put with its resin film side upward.

The thus superimposed matter was mounted in a pressing machine, and thereto the pressure of 40 kgf/cm$^2$ was applied for 20 seconds from the resin film side by means of a pressing tool heated to 340° C., thereby finishing a hot pressing operation.

While repeating the hot pressing operation mentioned above, the performance of each composite sheet was evaluated by examining the condition of contact between each composite sheet and the pressing tool, and the number of times that the hot pressing operation was repeated until the thermal curing of the anisotropic conductive film under the uniform pressure was not effected. The number of times the thermal curing had been effectively achieved was determined by checking the continuity between copper electrodes on the flexible printed circuit boards superimposed in the vertical direction. The results obtained are shown in Table 1.

Additionally, the pressing time in Example 3 was changed to 30 seconds because the film used therein was thicker than those used in the other examples.

TABLE 1

|  | Condition of contact to pressing tool | Endurance test (number of times each sheet can be used) |
| --- | --- | --- |
| Example 1 | no cling occurred | 72 |
| Example 2 | no cling occurred | 75 |
| Example 3 | no cling occurred | 55 |
| Example 4 | no cling occurred | 98 |
| Example 5 | no cling occurred | 61 |
| Comparative Example 1 | cling occurred | 48 |
| Comparative Example 2 | no cling occurred | 24 |
| Comparative Example 3 | no cling occurred | 14 |
| Comparative Example 4 | film melting occurred | — |

The effectiveness of thermally conductive heat-resistant silicone rubber composite sheets according to the invention is demonstrated by the results shown in Table 1. On the other hand, the sheet of Comparative Example 1 clung to the pressing tool by each hot pressing operation, so the workability was very low. In addition, that sheet lost its function by rupture in the endurance test.

What is claimed is:

1. A thermally conductive heat-resistant silicone rubber composite sheet comprising a silicone rubber sheet and a heat-resistant resin film layer on at least one side of the silicone rubber sheet, wherein the silicone rubber sheet and the heat-resistant resin film layer is bonded with a silicone adhesive, wherein said silicone rubber sheet is molded of a silicone rubber composition that comprises (A) 100 parts by weight of organopolysiloxanes which have an average polymerization degree of at least 200, (B) 10 to 100 parts by weight of carbon black containing volatile impurities except water in a content of at most 0.5 weight %, (C) more than 0 to less than or equal to 1,200 parts by weight of at least one thermally conductive substance selected from the group consisting of metals, metal oxides, metal nitrides and metal carbides and (D) a curing agent, provided that the total proportion of the components (B) and (C) is from 40 to 1,300 parts by weight, and the total of components (B) and (C) has volatile impurity content of at most 0.2 weight % when it is heated at 150° C. for 3 hours.

2. A thermally conductive heat-resistant silicone rubber composite sheet according to claim 1, wherein the silicone rubber composition further comprises 0.1 to 5 parts by weight of cerium oxide powder per 100 parts by weight of the component (A).

3. A thermally conductive heat-resistant silicone rubber composite sheet according to claim 1, wherein the heat-resistant resin film is a resin film having a glass transition temperature of 200° C. or above or a fluorine-contained resin film having a melting point of 300° C. or above.

4. A thermally conductive heat-resistant silicone rubber composite sheet according to claim 1, wherein said heat-resistant resin film is a resin film having a thickness of 5 to 300 μm.

5. A thermally conductive heat-resistant silicone rubber composite sheet according to claim 1, having a total thickness of 0.1 to 10 mm.

6. A thermally conductive heat-resistant silicone rubber composite sheet according to claim 1, wherein the heat-resistant resin film contains a thermally conductive powder.

7. A thermally conductive heat-resistant silicone rubber composite sheet according to claim 6, wherein the thermally conductive powder is at least one powder selected from the group consisting of carbon black, aluminum oxide and magnesium oxide powders.

8. A thermally conductive heat-resistant silicone rubber composite sheet according to claim 1, which is a sheet used in a hot pressing process.

9. A method of preparing a thermally conductive heat-resistant silicone rubber composite sheet according to claim 1, comprising molding a rubber composition into a sheet, heating the molded sheet at a temperature of 150° C. or above to remove volatile impurities therefrom, and bonding the heat-treated sheet to a heat-resistant resin film by the use of a silicone adhesive, wherein the silicone rubber composition comprises (A) 100 parts by weight of organopolysiloxanes having an average polymerization degree of at least 200, (B) 10 to 100 parts by weight of carbon black containing volatile impurities except water in a content of at most 0.5 weight %, (C) more than 0 to less than or equal to 1,200 parts by weight of at least one thermally conductive substance selected from the group consisting of metals, metal oxides, metal nitrides and metal carbides and (D) a curing agent, provided that the total proportion of the components (B) and (C) is from 40 to 1,300 parts by weight.

10. A thermally conductive heat-resistant silicone rubber composite sheet according to claim 1, wherein the silicone rubber sheet and the heat-resistant resin film are bonded with a primer and a silicone adhesive.

11. A thermally conductive heat-resistant silicone rubber composite sheet comprising a silicone rubber sheet and a heat-resistant resin film layer on at least one side of the silicone rubber sheet, wherein the silicone rubber sheet and the heat-resistant resin film is bonded with a silicone adhesive, wherein said silicone rubber sheet is molded of a silicone rubber composition that comprises (A) 100 parts by weight of organopolysiloxanes which have an average polymerization degree of at least 200, (C) 40 to 1,200 parts by weight of at least one thermally conductive substance selected from the group consisting of metals, metal oxides, metal nitrides and metal carbides and (D) a curing agent provided that component (C), and has a volatile impurity content of at most 0.2 weight % when it is heated at 150° C. for 3 hours, and wherein said heat-resistant resin film layer comprises (B) 10 to 100 parts by weight of carbon black.

* * * * *